United States Patent [19]

Cohen et al.

[11] 4,174,216
[45] Nov. 13, 1979

[54] PROCESS FOR IMAGE REPRODUCTION USING MULTILAYER PHOTOSENSITIVE TONABLE ELEMENT

[75] Inventors: Abraham B. Cohen, Springfield; Roxy N. Fan, East Brunswick, both of N.J.

[73] Assignee: E. I. Du Pont de Nemours and Company, Wilmington, Del.

[21] Appl. No.: 915,063

[22] Filed: Jun. 12, 1978

Related U.S. Application Data

[63] Continuation-in-part of Ser. No. 747,027, Dec. 2, 1976, abandoned, which is a continuation-in-part of Ser. No. 583,456, Jun. 3, 1975, abandoned.

[51] Int. Cl.$^2$ .......................... G03C 5/00; G03C 1/94
[52] U.S. Cl. ...................................... 430/257; 430/258
[58] Field of Search ................ 96/14, 15, 16, 28, 35.1, 96/67, 86 P, 87 R, 115 R, 115 P

[56] References Cited

U.S. PATENT DOCUMENTS

| | | | |
|---|---|---|---|
| 3,607,264 | 9/1971 | Celeste et al. | 96/28 |
| 3,620,726 | 11/1971 | Chu et al. | 96/28 |
| 3,754,920 | 8/1973 | Kuchta | 96/87 R |
| 3,785,817 | 1/1974 | Kuchta | 96/28 |
| 3,832,176 | 8/1974 | Verstrate et al. | 96/87 R |
| 3,891,441 | 6/1975 | Tsuji et al. | 96/35.1 |

*Primary Examiner*—Jack P. Brammer

[57] ABSTRACT

An image reproduction process which comprises exposing a multilayer element comprising (1) cover sheet, (2) photoadherent layer, and (3) tonable contiguous layer; stripping the cover sheet with either the exposed or unexposed areas of the photoadherent layer adhered thereto while the other areas of the photoadherent layer remain on the contiguous layer; and toning the areas of the contiguous layer from which the photoadherent layer were removed. Reverse and duplicate images can be produced.

20 Claims, 1 Drawing Figure

PROCESS FOR IMAGE REPRODUCTION USING MULTILAYER PHOTOSENSITIVE TONABLE ELEMENT

CROSS REFERENCE TO PRIOR APPLICATIONS

This is a continuation-in-part of application Ser. No. 747,027, filed Dec. 2, 1976 now abandoned, which is a continuation-in-part of application Ser. No. 583,456, filed June 3, 1975, now abandoned.

BACKGROUND OF THE INVENTION

1. Field of the Invention

The invention relates to the field of image reproduction with photosensitive elements, particularly those comprising polymeric layers, which are peeled apart in the process of forming images. Such elements are particularly useful for image reproduction for color proofing and related photomechanical uses, e.g., as lithographic transparencies, photomasks, photoresists, etc.

2. Description of the Prior Art

The prior art, e.g., Burg et al., U.S. Pat. Nos. 3,060,024 and 3,060,025; Celeste et al., U.S. Pat. No. 3,607,264; and Phlipot, U.S. Pat. No. 3,236,647, describes photopolymer elements and processes of use. Uncolored, photopolymerizable layers are selectively colored by applying colorants to imagewise exposed, clear photopolymerizable layers, so that the pigment adheres selectively to the unexposed areas. Chu and Cohen, U.S. Pat. No. 3,649,268 describes a process in which an element having a removable support and a photohardenable layer is (1) laminated to a receptor layer, and (2) imagewise exposed through the support to actinic radiation which selectively raises the stick temperature of those areas receiving the radiation, then (3) the support is stripped from the layers, and (4) the outer surface of the layer is treated (e.g., dusted) with a material, usually a colored pigment which adheres only to the unexposed areas of the layer thereby producing a positive image. By repeating the laminating, exposing with color separation records, stripping and treating steps in sequence, a multicolor image can be obtained. However, the process has the limitation of producing only a duplicate image (i.e., the pigment image is a duplicate of the image on the transparency used for exposure) and is therefore restricted in use, particularly where it is desired to produce a reverse image (i.e., an image which is complementary to the image on the transparency used for exposure).

Since the processes of the prior art generally produce toned images by adherence of toner to unexposed areas of a photopolymerizable layer, they produce duplicate images. A process is needed which will produce reverse toned images by a dry process for color proofs and photomasks, and in other areas where photopolymer systems are useful, e.g., color design work using custom colors. The elements of the prior art are also limited in the materials that can be used to provide a proper adhesion relationship, and peel apart elements of the prior art may have pinholes in the image due to improper adhesion.

SUMMARY OF THE INVENTION

In accordance with this invention an improved image reproduction process which comprises (1) exposing imagewise to actinic radiation a peel apart photosensitive element comprising, in order, from top to bottom (a) a strippable cover sheet, (b) a photoadherent layer comprising a material with ethylenically unsaturated or benzophenone type groups, (c) a tonable organic contiguous layer, and optionally (d) a sheet support;

(2) stripping the cover sheet from the element with either the exposed or unexposed areas of the photoadherent layer adhered to the cover sheet while the other areas of said photoadherent layer remain on said contiguous layer; and (3) toning by embedding colorant or particulate material into the areas of the contiguous layer from which areas of the photoadherent layer were removed.

BRIEF DESCRIPTION OF THE DRAWINGS

The FIGURE of the drawings shows a preferred embodiment comprising a strippable cover sheet (1), a photoadherent layer (2), a contiguous layer (3), and a support (4). The areas (5) of the photoadherent layer adhere to and are removed with the strippable cover sheet after imagewise exposure of the element to actinic radiation leaving areas (6) of the photoadherent layer remaining on the contiguous layer. In a particularly preferred embodiment, areas (5) are the exposed areas of the layer and areas (6) are the unexposed areas. The areas (7) of the contiguous layer, which are between the nontonable remaining areas (6) of the photoadherent layer, are then toned. In the particularly preferred embodiment, toning comprises embedding pigment particles into areas (7), producing a reverse toned image.

DESCRIPTION OF THE PREFERRED EMBODIMENTS

Figure 1:
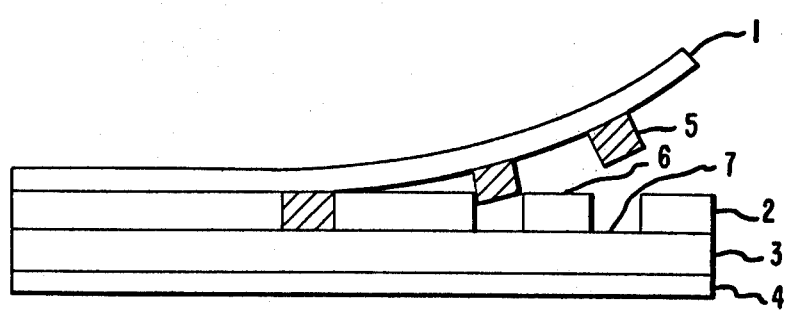

The invention is a versatile photosensitive process whereby a variety of images are produced, most preferably reverse images by a dry process. By "dry process" is meant a process in which liquids need not be used. The photoadherent layer, which is preferably the sole photosensitive layer of the element, is one whose adhesive relationship between the cover sheet and the contiguous layer is altered by exposure to actinic radiation, so that after exposure either the exposed or unexposed areas of the photoadherent layer adhere more strongly to the cover sheet than to the contiguous layer and are removed with the cover sheet, leaving the other areas remaining on the adjacent layer. In a particularly preferred embodiment, the exposed areas of the photoadherent layer adhere more strongly to the cover sheet after exposure and are removed therewith, leaving the unexposed areas of the photoadherent layer remaining on the contiguous layer. The areas of the photoadherent layer remaining on the contiguous layer after stripping off the cover sheet must be nontonable under a condition under which the contiguous layer is tonable so that the toner is accepted only by the contiguous layer. This condition may simply be room temperature with other normal ambient conditions; however, it is possible to select materials for the photoadherent layer and contiguous layer which differ in tonability only at an elevated temperature, or after heating and cooling, or in the presence of or after treatment with some reagent, etc. It is only required that under some condition the areas of the photoadherent layer remaining on the contiguous layer be nontonable while said contiguous layer is tonable. By "toning" is meant the embedding of material which modifies the surface that is toned. Most preferably, toning is the embedding of colorant or other particulate material. The material, referred to as "toner", may be a colorant such as pigment particles or dye containing material, radiation absorbing material, particulate detackifying material, etc. While it is most preferred to use a dry particulate material as the toner so that image formation is a dry process, dye dispersions and other liquids may be used in toning. The exposure and stripping of the cover sheet whereby an imagewise tonable element is formed is always a dry process according to the invention, however. The nontonable property of the remaining areas of the photoadherent layer and the tonable property of the contiguous layer may be due to their respective degrees of tackiness or softness which determine whether particulate material will adhere thereto or be embedded therein when applied, or they may be due to their respective degrees of absorptivity, hydrophilicity or reactivity with respect to the toner. In the most preferred embodiment, the contiguous layer contains more tacky material than the photoadherent layer and will therefore retain particulate material applied at room temperature while the remaining areas of the photoadherent layer will not.

The strippable cover sheet of the element of the invention must be strippable (i.e., removable by peeling it apart) from the rest of the element, carrying with it only exposed or unexposed areas of the photoadherent layer. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. In order to make the exposed areas of the photoadherent layer adhere better to the cover sheet, the cover sheet's surface may be modified; for example, the topography may be altered and the polarity increased by a surface treatment such as electrostatic discharge or flame treatment. In the case of a polyethylene terephthalate film having a thickness of 0.0005 inch, an electrostatic discharge of at least 0.025 coul./ft.$^2$ and preferably about 0.07 coul./ft.$^2$ is suitable. However, increased treatments may be used. Flame treatment of the film also will provide good photoadhesion. An air-propane flame may be used. The cover sheet may additionally undergo auxiliary treatment or bear layers to improve adhesion, strength, and other properties.

While the thickness of the cover sheet may be varied over a wide range, films having a thickness of 0.001 inch or less are particularly preferred. Thin cover sheets produce halftone dots of good roundness with sharp edges. In addition a tonal range of 2%-98% dot resolution (using a halftone screen with 150 lines/inch) and a rapid rate of cover sheet strippability is obtainable with thin cover films. By "tonal range" is meant the range of sizes of resolvable halftone dots as a percentage of a maximum dot size. In general, a rapid rate of cover sheet stripping produces better image quality. The cover sheet should be thick enough so that electrostatic discharge or flame treatment will not injure it and so that it may be stripped without tearing.

The photoadherent layer may adhere more strongly to the cover sheet than to the contiguous layer after exposure in either the exposed or unexposed areas. In the latter case, the photoadherent layer may be comprised of a photohardenable material such as that disclosed in U.S. Pat. No. 3,770,438 or other composition that adheres more strongly to the cover sheet than to the contiguous layer in the unexposed areas and more strongly to the contiguous layer than to the cover sheet in the exposed areas. Preferred photopolymerizable compositions are comprised of a macromolecular organic polymer binder and an addition polymerizable ethylenically unsaturated monomer which is present in excess amount of the absorptive capacity of the binder for the monomer so that a thin layer of substantially free monomer is present on the surface layer of the composition. Preferably the contact angle of the monomer on the cover sheet should be at least 2° greater than the contact angle of the monomer on the contiguous layer. The monomer should be substantially non-diffusible in the contiguous layer.

In the preferred embodiments, the exposed areas of the photoadherent layer adhere more strongly to the cover sheet than to the contiguous layer in the exposed areas and more strongly to the contiguous layer than to the cover sheet in the unexposed areas. In such embodiments, photohardenable materials are preferred for the photoadherent layer. Such materials are usually comprised of a material with ethylenically unsaturated or benzophenone-type groups in which an increase in molecular weight and, consequently, an increase in adherence to the cover sheet are caused by exposure to actinic radiation. The well-known photohardenable materials which are comprised of an ethylenically unsaturated material which is photopolymerizable, photocrosslinkable, photodimerizable or combinations thereof are preferred. Such materials are described, for example, in Chu et al., U.S. Pat. No. 3,649,268. Particularly preferred are photopolymerizable compositions comprised of a macromolecular organic polymer binder and an addition polymerizable ethylenically unsaturated monomer. The binder may be those disclosed in U.S. Pat. Nos. 3,469,982, 3,785,817, and 3,984,244 and may be a polar material such as an acidic polymer containing at least 1.5 mole percent free acid groups to impart polarity to the polymer. However, nonpolar binders, e.g., as described in U.S. Pat. Nos. 3,649,268 and 3,060,023 may also be used. The monomer has at least one and preferably two or more terminal ethylenically unsaturated groups capable of free radical initiated, chain propagated addition polymerization, said monomer preferably having some degree of polarity and being compatible with the binder and with the polar surface of the cover sheet, but substantially nondiffusible in the contiguous tonable layer. The photopolymerizable composition will also contain a free radical generating addition polymerization photoinitiating system (i.e., at least one organic photoinitiator compound) activatable by actinic radiation, e.g., ultraviolet and visible radiation. Among acidic binders which have been found useful, there may be mentioned co(methyl methacrylate/methacrylic acid) and monoethyl ester of poly methyl vinyl ether/maleic anhydride), each of which may be copolymerized in various proportions. Many other polar polymers and copolymers known in the art will be found useful as a binder in the photopolymerizable layer. Among the ethylenically unsaturated monomers which have been found useful are those disclosed in Plambeck, U.S. Pat. No. 2,760,863; Cohen and Schoenthaler, U.S. Pat. No. 3,380,831 and Chambers and Woodward U.S. Pat. No. 3,573,918. Also useful are epoxy monomers containing ethylenic unsaturation of the type disclosed in U.S. Pat. No. 3,661,576 and British Pat. No. 1,006,587. There may be mentioned as examples dipentaerythritol acrylate (50% tetra and 50% penta), pentaerythritol triacrylate and tetraacrylate, polypropylene glycol (50) ether of penaerythritol tetracrylate, polyethylene glycol (200) dimethacrylate, dipentaerythritol monohydroxy pentaacrylate, pentaerythritol triacrylate β-hydroxyethyl ether, polypropylene glycol (550) ether of pentaerythritol tetramethacrylate, pentaerythritol tetramethacrylate, polypropylene glycol (425) dimethacrylate, trimethylolpropane trimethacrylate, and polypropylene glycol (340) ether of trimethylol propane triacrylate. The binder may be varied widely in its ratio with the monomer but in general it should be in the range of 3:1 to 1:3. The monomer should be compatible with, and may be a solvent for, and/or have a plasticizing action on the binder. The choice and proportions of monomer and binder are made in accordance with the requirements of selective photoadherence to the coversheet and nontonability. In order to provide a nontonable composition, the monomer concentration is normally kept low so that the layer coated from the composition will be sufficiently hard and nontacky not to retain toner particles during toning of the element. Usually, the photoadherent layer will be clear, but for some applications a colored layer may be desired.

The free radical generating addition polymerization initiating systems activatable by actinic radiation may be, for example, any of those disclosed in Notley, U.S. Pat. No. 2,951,752; Chang and Fan, U.S. Pat. No. 3,549,367; Fan, U.S. Pat. No. 3,558,322; Chang, U.S. Pat. No. 3,926,643. Other particularly useful initiating systems are disclosed in Cescon et al., U.S. Pat. No. 3,615,454; Grubb, U.S. Pat. No. 3,647,467; Baum et al., U.S. Pat. No. 3,652,275; Chang, U.S. Pat. No. 3,661,558; and Strilko, U.S. Pat. No. 3,697,280. The photopolymerizable layer may also contain other ingredients including plasticizers, antihalation agents and optical brightening agents. By the incorporation of optical brightening agents in the photoadherent layer, the image record is produced free from distortion due to halation effects and free from discoloration due to element components. Suitable optical brighteners can be found in Keller, U.S. Pat. No. 2,784,183 and Gurney, U.S. Pat. No. 3,644,394. Specific compounds which are particularly useful in the photopolymerizable layers of this invention are 2-(stilbyl-4")-(naphtho-1',2':4,5)-1,2,3-triazol-2"-sulfonic acid phenyl ester hereinafter designated as Brightener I and 7-(4'-chloro-6'-diethylamino-1',3',5'-triazine-4'-yl) amino-3-phenyl-coumarin hereinafter designated as Brightener II. These compounds are useful in preparing sharp, bright, multicolor images with clean white backgrounds on toning with colorants as shown in U.S. Pat. No. 3,854,950.

While the coating weight of the photoadherent composition may be varied, it has been found that a preferred range from 20-100 mg/dm$^2$ (providing a dry layer thickness of about 0.00006-0.00033 inch) will give good image quality and tonal range.

The contiguous layer may be chosen from a great number of materials that will accept toner when bared by removal of areas of the photoadherent layer after imagewise exposure of the element to radiation that is actinic to the photoadherent layer. Preferably, the contiguous layer will be a nonphotosensitive tacky or slightly soft deformable organic material in which a particulate toner may be embedded or adhered. The contiguous layer may be colorless or colored as desired. For an element with good aging stability, suitable materials for the contiguous layer should restrain monomer diffusion from the photoadherent layer into the contiguous layer. Such materials may be selected from resins, polymers in which monomer of the photoadherent layer is nondiffusible, adhesive compositions, etc. Particularly preferred materials are elastomeric polymers and mixtures thereof having a second order transition temperature of −10° C. or lower which are inherently tacky or will accept tackifying agents and which are non-migratory into said photoadherent layer and which will impart tackiness to the layer. Rubber type polymers, both natural and synthetic may be used, e.g., polyisobutylene, Thiokol A, nitrile rubbers, butyl rubber, chlorinated rubbers, polymers of butadiene, poly(vinylisobutylether), polyisoprene and random, teleblock and block copolymers of butadiene or isoprene copolymerized with styrene; and neoprene, silicone elastomers, etc., in various proportions. With these materials, a stable adhesion balance between the photoadherent layer and a support for the contiguous layer, in a preferred element, may be achieved for elements useful in making color proofs by the overlay method or by the surprint method. These elastomeric materials are also preferred for their good tonability, i.e., ready acceptance and permanent retention of toners, e.g., pigment type colorants, and wide toning temperature latitude. The color density can also be further improved by the addition of tackifiers such as those described in Skeist, *Handbook of Adhesives*, Ch. 4, Reinhold Publishing Corp., 1962. Such tackifiers may comprise a polyterpene resin, a coumarone-indene resin, stabilized glycerol esters of abietic acid resin, stabilized acid wood rosin, a β-pinene polymer, and a cycloaliphatic resin. Particularly useful are the highly stabilized glycerol ester of abietic acid resin and low molecular weight cycloaliphatic hydrocarbon resins, both types having a softening point of about 85° C. The tackifier apparently associates with the rubber network of the elastomer and expands the volume fraction of the rubber phase, which tends to reduce stiffness and provides aggressive tackiness. Any suitable solvent may be used to coat the contiguous layer as long as it does not cause migration of components of the layer into the photoadherent layer when the two layers are coated simultaneously. The coating weight of the contiguous layer may be varied over a wide range, but generally a coating weight of about 40 mg/dm$^2$ (generally providing a dry thickness of about 0.00015 inch) will be satisfactory. The contiguous layer may also be coated as a dispersion, e.g., an aqueous dispersion with satisfactory results. In a preferred embodiment, which is illustrated in the drawings, the element has a support (4) for the contiguous layer (3). The support (4) may be any suitable film which has the necessary characteristics for the proper adhesion to layer (3) depending upon how the element is to be used, i.e., for surprint color proofing or overlay color proofing or for making photomasks, litho negatives, etc., for photomechanical processes. For color proofing by the overlay method, photographic grade polyethylene terephthalate films which may or may not contain an anchoring layer such as those disclosed in Alles, U.S. Pat. No. 2,779,684 may be used in the overlay method. Similar films which may or may not have a releasable coating, e.g., a silicone coating, may be used for the surprint method of colorproofing. A thermoplastic layer may also be used which allows a support (4) to be easily stripped from layer (3) yet holds layers (3) and (4) together when heat laminated or delaminated.

In the case where a thermoplastic coating is used, the stripping operation leaves the thermoplastic layer attached to the contiguous layer (3). A release film that does not require any special treatment is obviously the most convenient.

The manufacture of the above-described elements may be accomplished in several different ways. For example, the photoadherent layer (2) may be coated on the cover sheet (1) and then after drying, contiguous layer (3) is coated from a solvent solution and then after drying, a support (4) may be laminated to the surface of layer (3). The solvent for the contiguous layer (3) should not have any solubilizing or deleterious effect on photoadherent layer (2). Another method is to coat the photoadherent layer (2) onto the cover sheet (1) and coat layer (3) onto a support (4) and then after drying the coated layers, laminating the surfaces of layers (2) and (3) under pressure at room temperature or elevated temperature. Layers (2) and (3) may also be coated simultaneously in order on support (1) and then a support (4) may be laminated to the outer surface of layer (3). All of these methods are known to those skilled in the art of coating multilayer films.

The process of the invention is capable of producing duplicate or reverse images as desired, by a dry process. Accordingly, with an element as described in copending application Ser. Nos. 747,025 and 747,028 filed Dec. 2, 1976, a desired image may be produced simply by exposing, stripping the cover sheet, and toning. The tonable contiguous layer provides a layer whose composition may be selected to provide the proper balance in adhesion between the cover sheet, the photoadherent layer, and the contiguous layer. In preferred embodiments, the contiguous layer is tacky thereby providing good adhesion to the photoadherent layer, permitting the use of materials that photoadhere strongly to the cover sheet and so do not leave pinholes in the exposed areas. The contiguous layer can be toned to produce a reverse color image or to provide a background for a duplicate image.

In using the described film elements for making a color proofing image of the overlay type, the film elements are exposed to conventional halftone color separation negatives by means of actinic radiation to which the photoadherent layer is most sensitive, e.g., a carbon arc which is rich in ultraviolet radiation. Other radiation sources which may be used include mercury vapor or pulsed xenon lamps and lasers. The exposed elements are then delaminated at room temperature by stripping with a moderate to rapid continuous motion the cover sheet (1) from the element at an angle of generally at least 135° leaving a hardened positive image on the cover sheet and an image of uncovered contiguous layer on the element. The unexposed and nontonable image areas of photoadherent layer (2) remain on contiguous layer (3). The tonable image is toned with a suitable colorant, i.e., yellow, magenta, and cyan toning colorants, to give a color record. The process is repeated to produce separate color records which can be assembled in register in any desired order to give a three color proof, each color record being a unitary element by itself. A black toned key image may be and usually is included. The toner is preferably a particulate coloring material, e.g., a dry powder. Suitable toners are disclosed in Chu and Manger, U.S. Pat. Nos. 3,620,726 and 3,909,282. In the case of the overlay method color proofing, the adhesion of layer (3) to support (4) must be greater than the adhesive forces between layer (3) and the exposed areas of layer (2).

In the surprint method of color proofing, the adhesion between layer (3) and support (4) must be less than the adhesive forces between layers (2) and (3) and (2) and (1). In the surprint method, support (4) is stripped from the surface of contiguous layer (3), and the surface of the layer (3) is adhered to an opaque surface preferably under heat and pressure. Suitable opaque materials may be paper, plastic films, or metal supports, which have been especially treated to have a higher adhesion for layer (3) than the adhesive forces between layers (2) and (3) and cover sheet (1) and layer (2). The element is then exposed through a color separation negative, e.g., a minus-blue or yellow record, and through the cover sheet (1), and cover sheet (1) is then stripped off rapidly at an angle of at least 135° to give a hardened image adhered to cover sheet (1) and bared areas of the contiguous layer (3) corresponding to the hardened image. The resulting tacky image area is toned with the desired toner, e.g., yellow, and then the process is repeated by laminating the surface of layer (3) of a second element and again carrying out in registration the exposing, stripping and toning operations to give a second toned record, e.g., the magenta image. A third cyan record and a black key record may also be added in the same manner.

The invention provides a particularly preferred element using materials as described which has improved properties particularly suitable for the processes of the invention. The element with the preferred combination of materials comprises, in order, (1) a strippable cover sheet comprised of an electrostatic discharge or flame treated polymeric film which is transparent to actinic radiation, (2) a nontonable photohardenable layer which upon imagewise exposure to actinic radiation adheres to and is removable with said cover sheet only in the exposed areas, (3) a tacky nonphotosensitive contiguous layer which is tonable by application of particulate material, and (4) a sheet support.

The particulate material can be embedded or adhered in any manner known in the art, e.g., by dusting, rubbing with a pad or brush, cascading, with air under pressure, etc. The preferred photohardenable material is photopolymerizable, and the preferred cover sheet is polyethylene terephthalate. The preferred contiguous layer material is a tacky substance.

These elements utilize the combination of a tonable tacky contiguous layer which provides good adhesion to the photoadherent layer and a very high photoadhesion of electrostatic discharge or flame treated film to exposed photopolymer which overcomes the adhesion of the tacky contiguous layer only in the exposed areas. The tacky contiguous layer may be chosen to provide the proper balance of adhesive properties for the element and furthermore is extremely well suited to toning with particulate material, providing good adherence of particles and wide temperature latitude.

The use of the above-described elements provides a number of additional advantages over the elements of the prior art. A negative-working process is provided whereas the prior art elements of the above patents are generally limited to positive-working methods in their use, that is, a positive transparency produces a positive image.

An added advantage is that because both the nontonable photoadherent layer and the tonable contiguous layer can be clear, exposure to actinic radiation can be more efficient, and upon delamination and toning of the bared image areas of the contiguous layer, good, sharp images completely free of background stain are obtained. The integral contiguous layer of this invention eliminates the difficult handling operations in bringing a separate receptor in contact with tacky layers following exposure as is required in the prior art of thermal and pressure transfer processes. Since the contiguous layer is integral with the photoadherent layer during exposure, it also eliminates image distortions which could occur in establishing this contact after exposure. In addition, the contiguous layer and an adherent sheet support may provide a sufficiently impermeable barrier to oxygen to prevent oxygen inhibition of the polymerization reaction in the photoadherent layer. The elements of the present invention provide a method of obtaining very uniform color densities. When developed, the elements of the invention produce a novel structure having a polymeric image and a complementary toned image comprising a tonable layer bearing on its surface image areas of polymeric material and complementary toned image areas. Preferably, said toned image areas are areas of the tonable layer to which particulate material has been embedded.

EXAMPLES

The following Examples illustrate the invention.

EXAMPLE 1

An overlay type negative-working proof was made in the following manner:

I. Nontonable Photoadherent Layer: Photopolymerizable Coating Composition

For the photoadherent layer a coating solution of a photopolymerizable composition was prepared by mixing together the following ingredients:

| | |
|---|---|
| Poly(methyl methacrylate/methacrylic acid) (90/10) (M.W. 30,000–50,000) | 150.0 g. |
| Dipentaerythritol acrylate (50% tetra, 50% penta) | 130.0 g. |
| (2-Chlorophenyl-4,5-diphenyl imidazolyl) dimer | 8.0 g. |
| Brightener I (described above) | 5.0 g. |
| Brightener II (described above) | 2.25 g. |
| 2,2'-dihydroxy-4-methoxybenzophenone | 2.0 g. |
| 2-mercaptobenzothiazole | 4.0 g. |
| Methylene chloride | 1781.0 g. |
| Methyl alcohol | 155.0 g. |

Four samples of a Polyethylene terephthalate film having a thickness of 0.005 inch which had been surface treated by electrostatic discharge at 0.05 coulombs/ft$^2$ were coated with the above solutions at a coating weight of about 35 mg/dm$^2$ when dried.

II. Contiguous Layer: Tonable Tacky Elastomer Coating Composition

A coating solution was prepared by mixing together the following ingredients:

| | |
|---|---|
| Styrene-Butadiene Block Copolymer (30/70) (Brookfield Viscosity, 25% solution in toluene measured at 25° C. Brookfield Viscosimeter, Model LVF, Spindle No. 3 of 6 RPM, Min. 3000-Max 5000 cps.) | 600 g. |
| Highly stabilized glycerol ester resin of abietic acid (Softening point 82° C., Acid Number 9) (Foral 85, Hercules) | 450 g. |
| Methylene chloride to make | 6380 g. |

The solution was coated on samples of polyethylene terephthalate film having a thickness of 0.0025 inch to give a coating weight of about 100 mg/dm$^2$ when dried.

III. Laminating Procedure

The coated photopolymerizable layer elements (I) and the tonable tacky layer elements (II) were laminated in surface to surface relationship at room temperature with a pressure of 40 pounds per square inch.

IV. Exposure, Imaging and Toning Procedure

The laminated elements resulting from Step III were exposed through halftone color separation negatives including a black printer negative by means of a carbon arc (B-1C Constantarc-140 amp. No. 1112-Ld612 MacBeth Arc Lamp Co., Philadelphia, Pa.) for 15 seconds at 56 inches from the lamp. Five minutes after exposure, the elements were delaminated by peeling the electrostatic discharge treated polyethylene terephthalate cover sheet at an angle of about 180° at a rate of about 720 inches per minute. The resulting exposed areas of the photopolymerizable layer adhered to the electrostatic discharge treated cover sheet and were removed with said cover sheet as a positive image thereon. The complementary unexposed image areas remained on the contiguous layer and do not accept toner. Read-outs of the respective color records for the multicolored final proof were obtained by coloring the elements with the appropriate colored toners in the manner disclosed in the above Chu and Manger Patent, U.S. Pat. No. 3,620,726, the blue printer positive being toned with a yellow toner, the green printer positive being toned with a magenta or reddish toner, the red printer positive being toned blue and the black printer positive being toned with a carbon black pigment. The toner was applied by lightly rubbing the element with a fibrous pad containing the toner particles. The particles do not adhere to the areas bearing the nontonable unexposed photopolymerizable material but do adhere to the areas of the tonable contiguous layer from which the exposed, nontonable photopolymerizable material had been removed, thereby producing a reverse toned image. The elements were then assembled in register to give an excellent quality reverse color proof of the overlay type. Tests show that the elements are capable of resolving 0.001 inch isolated lines and render a tonal range of 2–98% (150 line/inch screen). Unexposed elements showed good aging stability under oven conditions of 50° C.

EXAMPLE 2

A negative-working color proof of the surprint type was made in the following manner:

I. Nontonable Photoadherent Layer: Photopolymerizable Coating Composition

For the photoadherent layer a coating solution of a photopolymerizable composition was prepared by mixing together the following ingredients:

| | |
|---|---|
| Poly(methyl methacrylate/methacrylic acid) (90/10) (M.W. 30,000–50,000) | 75.0 g. |
| Polyethylene glycol dimethacrylate | 57.5 g. |
| (2-Chlorophenyl-4,5-diphenyl imidazolyl) dimer | 6.0 g. |
| Brightener I (described above) | 0.79 g. |
| Brightener II (described above) | 3.55 g. |
| 2,2'-dihydroxy-4-methoxybenzophenone | 0.32 g. |
| 2-mercaptobenzothiazole | 2.0 g. |
| Methyl alcohol | 77.5 g. |
| Methylene chloride | 870.0 g. |

Four pieces of polyethylene terephthalate film having a thickness of 0.0005 inch which had been surface treated by electrostatic discharge at 0.05 coulombs/ft$^2$ were coated with the above solution at a coating weight of about 35 mg/dm$^2$ when dried.

II. Contiguous Layer: Tonable Tacky Elastomer Coating Composition

A coating solution was prepared by mixing together the following ingredients:

| | |
|---|---|
| Styrene/butadiene block copolymer (25/75) (Typical Mooney Viscosity ML4 at 100° C. 47) | 15 g. |
| Methylene chloride to make | 100 g. |

The solution was coated on samples of polyethylene terephthalate film having a releasable layer of polydimethyl siloxane coated thereon to give a coating weight of ~100 mg/dm$^2$ when dried.

III. Laminating Procedure

The coated photopolymerizable layer elements (I) and the tonable tacky layer elements (II) were laminated in surface to surface relationship at room temperature with a pressure of 40 pounds per square inch.

IV. Operations for Constructing a Surprint

The laminated elements resulting from Step III were handled as follows:

The polyethylene terephthalate cover sheet with the release coating was stripped from the tonable tacky layer of an element which was then laminated at 5 feet/minute and 100° C. to a paper support (identified as Kromkote marketed by the Champion Paper Corporation). The element was then exposed to a half-tone negative, minus-blue, color separation film record through the electrostatic discharge treated clear film cover sheet in contact with the nontonable, photopolymerizable layer for 15 seconds on an exposing device identified as a nuArc Plate Maker (flip-top) manufactured by the nuArc Company, Chicago, Illinois. The element was held for 5 minutes, and the clear film cover sheet was stripped from the tacky layer at an angle of from 135°–180° at a rate of higher than 720 inches per minute. The exposed, positive image photoadhered to the electrostatic discharge treated film thus exposing equivalent areas of the tacky elastomer contiguous layer. The bared areas of the contiguous layer were toned with a yellow toner as described in Example 1. A second photosensitive element was stripped off the release film and laminated to the surface of the yellow image and exposed to a halftone negative minus-green color separation film record in registration, the surface treated cover sheet was stripped from the contiguous layer leaving bared a positive image which was toned with a magenta (reddish) toner. The process was repeated for the minus-red and black negative records to give a high quality surprint color proof useful in the lithographic printing arts. The elements showed good stability under conditions of oven aging at 50° C. of over two weeks.

EXAMPLE 3

An overlay type of color proof was made in the following manner:

I. Nontonable Photoadherent Layer: Photopolymerizable Coating Composition

For the photoadherent layer a coating solution of a photopolymerizable composition was prepared by mixing together the following ingredients:

| | |
|---|---|
| hz,1/32 | |
| Poly(methyl methacrylate/methacrylic acid) (90/10) (M.W. 30,000–50,000) | 150.0 g. |
| Pentaerythritol triacrylate | 124.6 g. |
| (2-Chlorophenyl-4,5-diphenyl imidazolyl) dimer | 8.0 g. |
| Brightener I (described above) | 5.0 g. |
| Brightener II (described above) | 2.25 g. |
| 2,2'-dihydroxy-4-methoxybenzophenone | 2.0 g. |
| 2-mercaptobenzothiazole | 4.0 g. |
| Methylene chloride | 1781.0 g. |

Four samples of electrostatic discharge treated polyethylene terephthalate film were coated with the above solutions at a coating weight of 38 mg/dm$^2$ when dried.

II. Contiguous Layer: Tonable Tacky Elastomer Coating Composition

A coating composition was prepared by mixing the following ingredients:

| | |
|---|---|
| Styrene-Butadiene Block Copolymer (30/70) of Example 1 | 600.0 g. |
| Highly stabilized glycerol ester of abietic acid | 450.0 g. |
| Methylene chloride to make | 6380.0 g. |

The solution was coated on samples of polyethylene terephthalate film having a thickness of 0.0025 inch to give a coating weight of about 100 mg/dm$^2$ when dried.

III. Laminating Procedure

Carried out as in Example 1.

IV. Exposure, Imaging and Toning Procedure

Carried out as in Example 1 to give excellent quality overlay elements similar to those obtained in that Example.

EXAMPLE 4

Example 3 was repeated except that the monomer, pentaerythritol triacrylate, in the photopolymerizable layer was replaced with 124.0 grams of polypropylene glycol (450) ether of pentaerythritol tetraacrylate. The resulting overlay color proof was of good quality. The structure was capable of resolving 0.001 inch isolated lines and rendering 5–95% tonal range (150 line/ inch screen). The dot quality of the toned halftone images was excellent and the aging stability test in an oven at 50° C. showed no speed loss over a period of time greater than one week. Similar good quality color elements were obtained using polyethylene glycol dimethacrylate and trimethylolpropane triacrylate as the polymerizable monomeric compounds in the photopolymerizable layers.

EXAMPLE 5

Surprint type color-proofing elements were made in the following manner:

I. Nontonable Photoadherent Layer: Photopolymerizable Composition

A coating solution was prepared as in Example 2 and was coated on polyethylene terephthalate film having a thickness of 0.0005 inch which had been surface treated by electrostatic discharge at 0.07 coulomb/ft$^2$. The coating weight was about 43–47 mg/dm$^2$.

II. Contiguous Layer: Tonable Tacky Elastomer Coating Composition

A 15% solution of a block copolymer of styrene/butadiene (25/75) of Example 2 in methylene chloride was coated on an untreated polypropylene film to give a coating weight of about 120 mg/dm$^2$.

III. Laminating Procedure

Samples of the photopolymerizable element were laminated in surface to surface contact with the tacky elastomer layers on the polypropylene at room temperature with a pressure of 40 pounds per square inch.

IV. Preparation of Surprint Color Proofs

Samples from Step III were handled as described in Example 2, part IV, except that the polypropylene film was removed by stripping at an angle of 180° and after exposure, the holding time was two minutes. Good quality surprint proofs were obtained in all cases. Also polyfluoroethylene was used in place of the polypropylene and gave good release characteristics.

EXAMPLE 6

Example 2 was repeated except that the tonable tacky elastomer layer was coated on 0.0001 inch thick polyethylene film. All other operations of construction and use were carried out as outlined in Example 2 to give a good high quality surprint color-proof image useful in the printing industry.

EXAMPLE 7

Example 2 was repeated except that the tonable layer was coated from a 12% methylene chloride solution of a random copolymer of styrene and butadiene (43/57)(Raw Typical Mooney Viscosity 46) onto a 0.001 inch thick polyethylene terephthalate film which had a polydimethyl siloxane release coating. The coating weight of the tacky tonable elastomer layer was 120 mg/dm$^2$. All other operations were carried out as described in Example 2 to give a good quality color proof.

EXAMPLE 8

Example 1 was repeated except that in Part I in place of the binder, poly/methyl methacrylate/methacrylic acid 90/10, there was used a binder wherein the above ingredients were copolymerized in a ratio of 98.5/1.5 and in place of dipentaerythritol acrylate there was used pentaerythritol tetraacrylate in a ratio of binder to monomer of 1.3 to 1. All other coatings and procedures were carried out as in Example 1 to give a good quality overlay color proof.

EXAMPLE 9

Example 8 was repeated except that the binder in the photopolymerizable layer was composed of 86.5% methyl methacrylate and 13.5% methacrylic acid (relative viscosity of a 10% by weight solution on a calibrated Ubbeholde Viscometer (1B) at 25° C. was 4) and the monomer was polyethylene glycol (600) dimethacrylate and the ratio of binder to monomer was 1.7 to 1. A good quality overlay color proof was obtained.

EXAMPLE 10

An overlay type of color proof was made in the following manner:
I. Nontonable Photoadherent Layer: Photopolymerizable Coating Composition A coating solution was prepared by mixing together the following ingredients:

| | |
|---|---|
| Poly(methyl methacrylate/methacrylic acid)(90/10) of Example 1 | 15.0 g. |
| Polyethylene glycol dimethacrylate | 7.5 g. |
| (2-o-chlorophenyl-4,5-diphenyl imidazolyl) dimer | 1.2 g. |
| 2-mercaptobenzothiazole | 0.4 g. |
| Methylene chloride | 260.0 g. |

| -continued | |
|---|---|
| Methyl alcohol | 16.4 g. |

The resulting solution was coated on the electrostatic discharge treated polypropylene in place of the film of Example 1.

II. Contiguous Layer: Tonable Tacky Elastomer Coating Composition

This composition was the same as that in Example 2, except that the solution was coated on untreated polyethylene terephthalate film. Carrying out the rest of the operations as described in Example 1 the results showed that upon exposure, good photoadhesion occurred between the exposed areas of the photopolymerizable layer and the electrostatic discharge treated polypropylene film given good separation between the exposed photopolymer and the tacky tonable layer which allowed good color toning to give a high quality color image.

EXAMPLE 11

Example 10 was repeated except that the photopolymerizable layer was coated on 0.001 inch thick polyethylene terephthalate film treated with a propane flame as described in Bryan, U.S. Pat. No. 3,145,242. As in Example 10, good photoadhesion between the film and exposed photopolymer was determined to give good tonable layer elements upon separation of the exposed element.

EXAMPLE 12

Example 10 was repeated except that in the composition for the photopolymerizable layer there was added in addition to the ingredients present therein, 0.73 gram of 2,2'-dihydroxy-4-methoxybenzophenone. All other procedures were carried out as described in Example 2 to give a good quality surprint type color proof.

EXAMPLE 13

Example 10 was repeated except that in the composition for the nontonable photopolymerizable layers there was added in addition to the ingredients therein, 15.0 grams of 4:4'-bisdimethylaminobenzophenone. All other procedures were carried out as described in Example 2 to give a good quality surprint type color proof.

EXAMPLE 14

An overlay type color proof was made as follows:
I. Nontonable Photoadherent Layer: Photopolymerizable Coating Composition A coating solution was prepared by mixing together the following ingredients:

| | |
|---|---|
| Poly(methyl methacrylate/methacrylic acid) (90/10) of Example 1 | 75.0 g. |
| Pentaerythritol tetraacrylate | 57.5 g. |
| (2-o-chlorophenyl-4,5-diphenyl imidazolyl) dimer | 4.0 g. |
| Brightener I (described above) | 2.5 g. |
| Brightener II (described above) | 1.12 g. |
| 2,2'-dihydroxy-4-methoxybenzophenone | 1.0 g. |
| 2-mercaptobenzothiazole | 2.0 g. |
| Methyl alcohol | 77.5 g. |
| Methylene chloride | 890.5 g. |

The resulting composition was coated on a 0.0005 inch thick polyethylene terephthalate film electrostatic discharged treated at 0.07 coulombs/ft$^2$.

II. Contiguous Layer: Tonable Tacky Elastomer Coating Composition

A coating solution was prepared by mixing together the following ingredients:

| | |
|---|---|
| Styrene/butadiene block copolymer (30/70) of Example 1 | 100.0 g. |
| Modified cycloaliphatic hydrocarbon resin (tackifier) (softening point R & B, 105° C., Permalyn ® XAR, Hercules) | 74.0 g. |
| Methylene chloride to make | 1160.0 g. |

The resulting solution was coated on 0.0025 inch thick polyethylene terephthalate film to give a calculated coating weight of 113 mg/dm$^2$.

III. Laminating Procedure

The surfaces of the photopolymerizable layer and the tacky tonable elastomer layer were laminated to each other at room temperature with a pressure of 40 pounds per square inch.

IV. Exposure, Imaging and Toning Procedure

These operations were carried out as described under Part IV of Example 1 above to give a good quality overlay color proof.

EXAMPLE 15

Example 14 was repeated except as a tackifier in the tonable layer composition there was used a polyterpene resin (softening point R & B, 115° C., Terpalyn ® XC11S, Hercules) in place of the modified cycloaliphatic resin of that example. All other compositions and operations were carried out as in Example 14 to give a good quality overlay type color proof.

EXAMPLE 16

Example 14 was repeated except as a tackifier in the tonable layer composition there was used an unmodified cycloaliphatic resin (softening point R & B, 85° C., Permalyn ® XAB5, Hercules) in place of the modified cycloaliphatic resin of that Example. All other compositions and operations were carried out as in Example 14 to produce a good quality overlay type of color proof.

EXAMPLE 17

A color proof of the surprint type was made in the following manner:

I. Nontonable Photoadherent Layer: Photopolymerizable Coating Composition

A coating solution was prepared and coated as disclosed in Part I of Example 2.

II. Contiguous Layer: Tonable Tacky Elastomer Coating Composition

A coating composition was prepared by mixing the ingredients disclosed under Part II and Example 14.

III. Thermal Adhesive Layer

A coating composition was prepared by mixing the following ingredients:

| | |
|---|---|
| Polymethyl methacrylate | 75.0 g. |
| Polyethylene glycol dimethacrylate | 35.0 |
| Methylene chloride to make | 1000.0 g. |

The resulting solution was coated on a 0.001 inch thick, polypropylene film and dried to give a dry coating weight of 35 mg/dm$^2$. The tonable layer composition from II above was coated over the surface of the above coated layer to give a coating weight of about 100 mg/dm$^2$.

IV. Laminating Procedure

The surface of the photopolymerizable layer of Part I was laminated to the surface of the tonable layer of the element of Part III at 30° C. and at a pressure of 40 pounds per square inch.

V. Operations for Constructing a Surprint

Structures as described above were transferred as desired in Part IV of Example 2 after polypropylene supports of each element as constructed in Part III were delaminated, and the surface of the thermal adhesive layer which remains on the tonable layer is laminated to the paper support at a temperature of 100° C. and a pressure of 40 pounds per square inch. All other operations were carried out as described under Part IV of Example 2 to form a good quality surprint type color proof.

EXAMPLE 18

An overlay color proof film was made in the following manner:

I. Nontonable Photoadherent Layer: Photopolymerizable Coating Composition

A coating solution was made by mixing the following ingredients:

| | |
|---|---|
| Poly(methyl methacrylate/methacrylic acid) (90/10) of Example 1 | 75.0 g. |
| Polyethylene glycol dimethacrylate | 42.5 g. |
| (2-o-Chlorophenyl-4,5-diphenyl imidazolyl) dimer | 6.0 g. |
| Brightener I (described above) | .79 g. |
| Brightener II (described above) | 3.55 g. |
| 2,2'-dihydroxy-4-methoxybenzophenone | .315 g. |
| 2-mercaptobenzothiazole | 2.0 g. |
| Methyl alcohol | 77.5 g. |
| Methylene chloride to make | 1000.0 g. |

The resulting solution was coated on electrostatic discharge treated polyethylene terephthalate film as described in Example 2 to give a coating weight of 40 mg/dm$^2$.

II. Contiguous Layer: Tonable Elastomer Coating Composition

A coating solution was prepared by mixing the following ingredients:

| | |
|---|---|
| Block Copolymer of Styrene/Isoprene (15/85) (Brookfield viscosity, 25% solution in toluene measured at 25° C., 1200 2000 cps., Brookfield Viscosimeter, Model LVF, Spindle No. 3 at 6 RPM) | 12.00 g. |
| Methylene chloride to make | 100.0 g. |

The resulting solution was coated on 0.0025 inch thick polyethylene terephthalate film to give a coating weight of 84.0 mg/dm$^2$.

III. Laminating Procedure

Films for each color record (four) from Parts I and II were laminated as described in Example 1.

IV. Operations for Constructing an Overlay Color Proof

Carried out as described in Example 1 to give a good quality overlay color proof.

EXAMPLE 19

Example 18 was repeated using in place of the block copolymer of styrene/isoprene (15/85), a teleblock copolymer of styrene/butadiene (30/70) (inherent viscosity, THF 1.50). The resulting color proof was of high quality and comparable to that obtained in Example 1.

EXAMPLE 20

A color proof of the surprint type was made in the following manner:

I. Nontonable Photoadherent Layer: Photopolymerizable Coating Composition

Prepared and coated as described in Part I of Example 2 except the polyethylene terephthalate film was electrostatic discharge treated at 0.07 coulombs/ft$^2$.

II. Contiguous Layer: Tonable Tacky Elastomer Coating Composition

A coating composition was prepared by mixing together the following ingredients:

| | |
|---|---|
| Cis-polybutadiene (Raw Mooney Typical Viscosity 40) | 360.0 g. |
| Random copolymer of styrene/butadiene (40/60) (Raw Mooney Typical Viscosity 34) | 240.0 g. |
| Tetra bis[methylene 3-(3',5'-di-t-butyl-4'-hydroxyphenyl) proprionate] methane | 3.0 g. |
| Methylene chloride | 5400.0 g. |

The resulting solution was coated on samples of polyethylene terephthalate film having a releasable layer of polydimethyl siloxane coated thereon to give a coating weight of 100 mg/dm$^2$ when dried to give a layer of cispolyisobutadiene and polystyrene copolymer in a ratio of 60/40.

III. Laminating Procedure

Carried out as described in Example 2, Part III except that the laminating temperature was 50° C.

IV. Operations for Constructing a Surprint Color Proof

These operations were carried out as described in Example 2, Part IV except that the tacky layers after removal of the polyethylene terephthalate films with the release layers, were laminated to the paper support at room temperature. A surprint was obtained which was comparable in quality and aging stability to that obtained in Example 2.

EXAMPLE 21

Example 20 was repeated except that the cis-polybutadiene and polystyrene/butadiene copolymer in the tacky elastomer of Part II was compounded in the ratio of 70/30. A good quality surprint type color proof was obtained.

EXAMPLE 22

Example 20 was repeated except that the polystyrene copolymer was omitted from the tacky tonable layer coating composition and only the cis-polybutadiene was used in an amount to give a 9% methylene chloride solution. A good quality surprint was produced.

EXAMPLE 23

An element was made in the following manner:
I. Nontonable Photoadherent Layer: Photopolymerizable Coating Composition

| | |
|---|---|
| Poly(methyl methacrylate/methacrylic acid) (90/10) | 15.00 g. |
| Pentaerythritol triacrylate β-hydroxy ethyl ether | 13.50 g. |
| (2-0-Chlorophenyl-4,5-diphenyl imidazolyl) dimer | 0.80 g. |
| Brightener I (described above) | 0.45 g. |
| Brightener II (described above) | 0.23 g. |
| 2,2'-dihydroxy-4-methoxybenzophenone | 0.20 g. |
| *-continued* | |
| 2-mercaptobenzothiazole | 0.40 g. |
| C.I.S. Red 109 | 0.36 g. |
| Methylene chloride | 235.00 g. |
| Methyl alcohol | 30.00 g. |

The resulting composition was coated on the polyethylene terephthalate electrostatic discharge treated film described in Example 1 to give a coating weight of 40 mg/dm$^2$ when dried.

II. Contiguous Layer: Tonable Tacky Elastomer Coating Composition

A coating solution as prepared in Part II, Example 1 was coated on a 0.0025 inch thick polyethylene terephthalate film at a coating weight of 120 mg/dm$^2$ when dried.

III. Laminating Procedure

The red colored photopolymerizable element and the clear tacky layer elements were laminated in surface to surface relationship at room temperature with a pressure of 40 pounds per square inch.

IV. Exposure, Imaging and Toning Procedure

A sample of the element was exposed through an image bearing transparency and delaminated as described in Part IV of Example 1 to give a tonable image on the tacky layer which could be toned with any desired color, e.g., white, except the C.I.S. Red 109 used in the photopolymerizable composition of Part I to give a two-color image suitable for use as a projection slide for visual aid purposes. There was also obtained a red reverse image on the cover sheet which can also be used for the same purpose. By repeating the process with the appropriate colored photopolymer layers, an overlay color proof could be obtained using the above elements. By toning the tacky tonable layers from which the exposed photoadherent layer was removed with a white toner a duplicate overlay color proof was obtained.

EXAMPLE 24

Overlay color proof elements were made in the following manner:
I. Nontonable Photoadherent Layer: Photopolymerizable Coating Composition A coating composition was prepared as in Example 2 and was coated on polyethylene terephthalate film having a thickness of 0.0005 inch which had been surface treated by electrostatic discharge treated at 0.07 coulombs/ft$^2$. The coating weight was about 43–47 mg/dm$^2$.

II. Contiguous Layer: Tonable Tacky Elastomer Coating Composition

A 7.7% solution in methylene chloride was made using a stereospecific polybutadiene rubber containing 36% cis polymer and the balance is the trans polymer. The measured viscosity of the polymer solution is 3200 using a #4 spindle at 60 RPM (Brookfield Viscometer). The polymer has a narrow molecular weight distribution and is completely amorphous.

The resulting solution was coated on a 0.0025 inch thick polyethylene terephthalate film in an amount of about 80 mg/dm$^2$ when dried.

III. Laminating Procedure

Samples of the photopolymerizable element were laminated in surface to surface contact with the tacky elastomer layers at a temperature of about 25° C. with a pressure of about 40 pounds per square inch.

IV. Preparation of Overlay Color Proofs

Elements resulting from Step III were exposed through the appropriate halftone color separation negatives including a black printer negative. The elements were delaminated as described in Example 1 and toned and assembled as described therein to give a high quality overlay color proof.

EXAMPLE 25

A high quality map was made by the surprint procedure in the following manner:

I. Nontonable Photoadherent Layer

A coating composition was prepared and coated as described in Example 24, Part I.

II. Contiguous Layer

A coating composition was made as described in Example 20, Part II and coated on the releasable layer coated polyethylene terephthalate film as described in Example 25, Part II.

III. Laminating Procedure

Elements I and II were laminated as described in Example 24, Part III. As many elements were made as determined by the number of colors required for the map.

IV. Operations For Constructing a Surprint Map

An element was stripped of the releasable coating from the surface of the contiguous layer and the element was laminated to the surface of a paper support as described in Example 2, Part IV. The element was then exposed through a negative transparency of the road system of the map. The clear cover sheet was stripped off leaving a bared tacky tonable image of said road system which was toned magenta. A second element was stripped of its releasable layer and laminated to the paper element containing the toned red image of the road system. The resulting element was then exposed to a negative transparency color separation record of elevated geographical areas to be colored yellow. The above process was repeated and the yellow toner applied. Another element was applied and exposed to a negative transparency color separation record of the water areas, i.e., lakes, rivers and streams, etc. The bared tacky image of this record was toned with a blue color.

The process was repeated again using a negative transparency color separation record of railroads and power lines which was toned black. The process was repeated for lower elevation areas which were toned green. All negative separation records were of course exposed in precise registration. Over the resulting colored image layer combination there was laminated with pressure a clear layer of the element described under I above. This provided a high quality map showing the precise detail of the original.

EXAMPLE 26

An element wherein the photopolymer layer contains a colorant.

I. Nontonable Photoadherent Layer

A polyethylene terephthalate photographic grade film, having a thickness of 0.001 inch but having no surface treatment, was coated with the following photopolymerizable composition:

| | |
|---|---|
| Polymethyl methacrylate (Inherent Viscosity: 0.26–0.22 for a solution of 0.25 in 50 mls. chloroform, at 20° C., using a No. 50 Cannon-Fenske Viscosimeter) | 17.75 g. |
| Polymethyl methacrylate (Inherent Viscosity: 1.25–1.50 for a solution of 0.25 g. in 50 mls. chloroform at 20° C., using a No. 50 Cannon-Fenske Viscosimeter) | 12.50 g. |
| Polyoxyethylated trimethylol propane triacrylate (20 moles of ethylene oxide) (M.W. 1162) | 32.25 g. |
| Phenanthrenequinone | 1.25 g. |
| Carbon Black | 36.25 g. |
| Trichloroethylene/methylene chloride (60/40) to make a 12% solids solution | |

The coating weight was 37.9 mg/dm$^2$ (dry).

II. Contiguous Tacky Tonable Layer

A coating solution was prepared using a stereospecific polybutadiene (98% cis, 2% trans) rubber. The solution was made up as a 9% concentration in methylene chloride. It was coated on a 0.0025 inch thick polyethylene terephthalate film in an amount of about 80 mg/dm$^2$.

III. Lamination Procedure

Elements from I and II were laminated in surface to surface contact at room temperature and about 40 pounds per square inch pressure.

IV. Exposure and Delamination

The element was exposed to an image transparency by means of an exposing device identified as a "nuArc Plate Maker (Flip-Top)" manufactured by the nuArc Company, Chicago, Illinois. There was evidence of image formation by means of photoadherence to the 0.001 inch polyethylene terephthalate film and the bottom layer can be toned with a white toner to give a positive working system. The cover sheet contained a negative working image.

EXAMPLE 27

Example 26 was repeated except that the cover sheet polyethylene terephthalate film was surface treated by exposure to electrostatic discharge (0.07 coulombs/ft$^2$) good adhesion was obtained and good images were formed on the treated cover sheet which could be used as a negative-working phototool, i.e., visual aid slides, exposure transparencies, and color proofing, etc.

The bared tacky layer could be toned with any desired color and/or white toner to provide the desired phototool or final product by a positive-working system.

The foregoing examples represent preferred embodiments of the invention, wherein the exposed areas of the photoadherent layer adhere to and are removed by stripping the cover sheet, the areas of the photoadherent layer which remain on the contiguous layer being nonreceptive to toner particles due to their nontacky nature and the bared areas of the contiguous layer being receptive to toner particles due to their tacky nature. However, the difference in receptivity to toner may be effected by an intermediate treatment, e.g., exposure to actinic radiation, in other embodiments. As used herein, therefore, "tonable" means receptive or capable of being rendered receptive to toner and "nontonable" means nonreceptive or capable of being rendered nonreceptive to toner. The terms, of course, have reference to the same toner. In preferred embodiments, no intermediate treatment is required, the difference in tonability existing at least immediately after stripping the cover sheet.

EXAMPLE 28

A negative working element was made in the following manner:

I. Nontonable Photoadherent Layer: Photohardenable Coating Composition

| | |
|---|---|
| Poly(acryloxybenzophenone/diacetone acrylamide/methylmethacrylate)(20/10/70)(MW 500,000) | 2.5 g. |
| Tetraethylene glycol dimethacrylate | 1.25 g. |
| (2-o-chlorophenyl-4,5-diphenyl imidazolyl) dimer | 0.14 g. |
| 2-Mercaptobenzothiazole | 0.10 g. |
| Methylene choride | 36 g. |

The resulting composition was coated on the polyethylene terephthalate electrostatic discharge treated film described in Example 1 and dried to give a coating weight of 47 mg/dm$^2$.

II. Contiguous Layer: Tonable Tacky Elastomer Coating Composition

A coating solution as prepared in Part II, Example 20 was coated on polyethylene terephthalate film having a releasable layer of polydimethyl siloxane coated thereon and dried to give a coating weight of 115 mg/dm$^2$.

III. Laminating Procedure:

The surface of the contiguous layer was laminated at 82° C. to a paper support (identified as Kromkote ® marketed by the Champion Paper Corporation). The polyethylene terephthalate film with the release coating was stripped from the tonable tacky layer which was then laminated to the coated photohardenable layer element (1) in surface to surface relationship at room temperature with a pressure of 40 pounds per square inch.

IV. Exposure, Imaging and Toning Procedure

The element resulting from step III was exposed to a half-tone negative, film record through the electrostatic discharge treated clear film cover sheet in contact with the nontonable, photohardenable layer for 30 seconds as on the exposing device of Example 2. As in Example 1, the cover sheet with the exposed photohardened image thereon was removed and the bared areas of the contiguous layer were toned with magenta toner to give a single color proof print.

EXAMPLE 29

A negative working element was made in the following manner:

I. Nontonable Photoadherent Layer: Photohardenable Coating Composition

| | |
|---|---|
| Poly(methyl methacrylate/methacrylic acid) 90/10 (M.W. 30,000–50,000) | 59.6 g. |
| Di-(3-methacryloxy-2-hydroxypropyl) ether of Bisphenol-A | 119.24 g. |
| (2-o-Chlorophenyl-4,5-diphenyl imidazolyl) dimer | 6.6 g. |
| Brightener I (described above) | 1.62 g. |
| Brightener II (described above) | 7.8 g. |
| 2,2'-dihydroxy-4-methoxybenzophenone | 0.6 g. |
| 2-mercaptobenzothiazole | 3.0 g. |
| poly(ethylene oxide) (M.W. ca 1,000,000) | 1.52 g. |
| Methylene chloride | 1600 g. |
| Methanol | 54.0 g. |

The resulting composition was coated on untreated polyethylene terephthalate and dried to give a coating weight of 32.8 mg/dm$^2$.

II. Contiguous Layer: Tonable Tacky Elastomer Coating Composition

A contiguous layer coated on polyethylene terephthalate having a releasable layer was prepared as in Part II, Example 20, except that 480 g of cis-polybutadiene and 120 g of random copolymer of styrene/butadiene (40/60) are used.

III. Laminating Procedure

The coated photopolymerizable element (I) and the tonable tacky layer element (II) were laminated in surface to surface relationship at 105° C. with a pressure of 40 lbs. per square inch.

IV. Operations for Constructing a Print

The laminated elements resulting from Step III were handled as follows:

The polyethylene terephthalate cover sheet with the release coating was stripped from the tonable tacky layer of an element which was then laminated at 100° C. to a paper support (identified as Kromekote ® marketed by the Champion Paper Corporation). The element was then exposed to a half-tone negative, minus green, color separation film record through untreated clear film cover sheet in contact with the nontonable, photopolymerizable layer for 15 seconds on an exposing device identified as a nuArc Plate Maker (flip-top) manufactured by the nuArc Company, Chicago, Illinois. The element was held for 1 minute, and the clear film cover sheet was stripped from the tacky layer at an angle of from 135°–180° at a rate of higher than 720 inches per minute. The exposed, positive image photoadhered to the untreated film thus exposing equivalent areas of the tacky elastomer contiguous layer. The bared areas of the contiguous layer were toned with a magenta (reddish) toner as described in Example 1 to give a high quality magenta proof. A high quality surprint color proof useful in the lithographic printing arts may be prepared using the elements resulting from Step III using the procedures of Step IV in Example 2.

EXAMPLE 30

Four negative working laminated elements were made in the manner described in Example 29 except that in step (I) 62.46 g of Di-(3-methacryloxy-2-hydroxypropyl)ether of Bisphenol A was used and instead of poly(methyl methacrylate/-methacrylic acid), 116 g of one of the following binders was used for each element:

A. Cellulose acetate butyrate (6% acetate, 46% butyrate)
B. Polymethylmethacrylate (inherent viscosity ca 1.20)
C. Poly(styrene/acrylonitrile) (78/22)
D. Methacrylate/acrylonitrile/butadiene/styrene (46/9/-31/14) resin In addition, each resulting solution was coated on a sample of polyethylene terephthalate having a thickness of 0.005 inch which had been surface treated by electrostatic discharge at 0.07 columbs/ft.$^2$ and dried to give a coating weight of about 30 mg/dm$^2$.

A high quality colored proof was prepared from each of the four laminated elements as described in Step (IV) of Example 29 wherein the exposed positive image photoadhered to the electrostatic discharge treated film when it was removed from the element.

EXAMPLE 31

An element was made in the following manner:

I. Nontonable Photoadherent Layer: Photopolymerizable Coating Composition

| | |
|---|---|
| Partially esterified copolymer of styrene and maleic anhydride (1:1 ratio, M.S. 1700) (SMA resin by Arco) (25% esterified with isopropanol and methanol) | 4.50 g. |
| Terpolymer of methyl methacrylate, ethyl acrylate and acrylic acid (37:56:7) (M.W. 260,000) | 214.0 g. |
| Triethylene glycol methacrylate | 166.0 g. |
| 2,2'-Dihydroxy-4-methoxybenzophenone | 50.0 g. |
| Orasol blue 2GLN dye | 50.0 g. |
| (2-o-Chlorophenyl-4,5-diphenyl imidazolyl) dimer | 50.0 g. |
| 4,4-Bisdimethylaminobenzophenone | 5.0 g. |
| Methylene chloride | 3710.0 g. |
| Methanol | 415.0 g. |

The resulting composition was coated on the 0.001 inch polyethylene terephthalate electrostatic discharge treated film of Example 1 to give a dry coating weight of 28 mg/dm$^2$.

II. Contiguous Layer

A contiguous layer element was prepared as described in Example 16.

III. Process

The photoadherent layer (I) and contiguous layer (II) were laminated as in Example 23, Part III, and processed as in Example 23, Part IV, to give an overlay proof.

EXAMPLE 32

An element was made in the following manner:

I. Nontonable Photoadherent Layer

Same as that of Example 2, Part I.

II. Contiguous Layer

A coating solution was prepared from the following materials:

| | |
|---|---|
| Styrene/butadiene block copolymer (25/75) Typical Mooney Viscosity ML-4 at 100° C.: 47) | 300.0 g. |
| C.I.S. red 109 dye (1% solution in methanol) | 60.0 g. |
| Methylene chloride | 1700.0 g. |

The resulting solution was coated on 0.0025 inch polyethylene terephthalate support to give a dry coating weight of 90 mg/dm$^2$.

III. Process and Operation

The photoadherent layer (I) and contiguous layer (II) were laminated together as in Example 23, Part III. After imagewise exposure, the exposed photopolymerizable material adhered to the 0.0005 inch polyethylene terephthalate electrostatic discharge treated cover sheet when delaminated in the normal way. The bared areas of the tonable layer were toned with cyan toner to give a two color image suitable for use as a projection slide for visual aid purpose.

As described above, the developed elements of the invention produce a novel image bearing structure comprising a tonable layer bearing on its surface image areas of polymeric material and complementary toned image areas. It is particularly useful to produce a multilayer element comprising a plurality of image bearing elements of the invention, which has an image that is a composite of the images of the individual elements. In such a multilayer element the individual elements are laminated successively or assembled in register with the tonable layer of an element adjacent to, and preferably in surface to surface contact with, the image bearing surface of another element. A multicolor element can thereby be made if images of at least two of the elements are of different color, are laminated to produce a multicolor composite image.

In place of colored toners, it is possible to tone the exposed and delaminated layers of this invention with powders which are magnetic, catalytic for various chemical and electrochemical processes, etc. For example, by toning with metal powder, e.g., copper, one obtains an image which can be electrolessly plated to form a circuit element, and by repeated lamination, imaging, stripping, toning with copper powder, and electrolessly plating, one can prepare a multilayer circuit board.

The surface of the color prints shown in the examples can be delustered by laminating the tacky, tonable layer of a fresh element to the print, exposing the entire surface nonimagewise through a tint to actinic radiation, stripping off the photoadherent layer and dusting the tonable layer with a particulate material, e.g., talc, etc.

EXAMPLE 33

An element was made in the following manner:

I. Photoadherent Layer:

A photoadherent layer which adheres to the cover sheet only in the unexposed areas was made of a photopolymerizable coating composition prepared as follows:

| | |
|---|---|
| Chlorinated rubber (Parlon ® S-5 manufactured by Hercules Co.) (67% chlorinated - 20% solution in toluene at 25° C. has a viscosity of 4–7 centipoises). | 22.0 g. |
| Pentaerythritol triacrylate | 15.0 g. |
| 2-t-Butylanthraquinone | 2.0 g. |
| 2,2'Methylene-bis-(9 ethyl-6-t-butylphenol) | 2.0 g. |
| Methyl chloroform | 330.0 g. |

The ingredients were thoroughly mixed and coated using a 0.004-inch doctor knife coating on 0.001-inch polyethylene terephthalate base and allowed to dry.

II. Continguous Layer: Tonable Tacky Elastomer Coating Composition

A coating composition was prepared by mixing together the following ingredients:

| | |
|---|---|
| Cis-polybutadiene (Raw Mooney Typical Viscosity 40) | 360.0 g. |
| Random copolymer of styrene/butadiene (40/60) (Raw Mooney Typical Viscosity 34) | 240.0 g. |
| Tetra bis[methylene 3-(3',5'-di-t-butyl-4'-hydroxyphenyl) propionate]methane | 3.0 g. |
| Methylene chloride | 5400.0 g. |

The resulting solution was coated onto 0.0025-inch transparent polyethylene terephthalate support to give a dry coating weight of 100 mg/dm$^2$.

III. Lamination Procedure

The photoadherent layer (I) and the contiguous layer (II) were laminated together in surface to surface relationship under pressure at 40 pounds per square inch at room temperature.

IV. Exposure, Imaging and Toning Procedure

The laminated elements resulting from Step III were exposed through halftone separation positives (next to 0.001-inch polyethylene terephthalate cover sheet) by means of a pulsed Xenon lamp (nuArc Flip-Top Model 7 ampere) for four minutes. Five minutes after exposure, the 0.001-inch polyethylene terephthalate cover sheet was delaminated (stripped) at an angle at least of 135° and at a rate of about 600 inch/minute (slow rate). The unexposed areas of the clear photopolymerizable layer adhered to the 0.001-inch polyethylene terephthalate cover sheet and were removed with the said cover sheet leaving bared areas of the tonable contiguous layer on 0.0025-inch polyethylene terephthalate support. Complementary exposed image areas remained on the contiguous layer and do not accept toner. Copies from the respective color records for the multicolored final proof were obtained by coloring the elements with the appropriate colored toners in the manner disclosed in U.S. Pat. No. 3,620,726, the blue printer positive being toned with a yellow toner, the green printer positive being toned with a magenta or reddish toner, the red printer positive being toned blue and the black printer positive being toned with a carbon black pigment. The toner was applied by lightly rubbing the element with a fibrous pad containing the toner particles. The toner particles do not adhere to the areas bearing the nontonable exposed photopolymerizable material but do adhere to the areas of the tonable contiguous layer from which the unexposed, photopolymerizable material has been removed, thereby producing a positive working toned image. The elements were then assembled in register to give a quality positive color proof of the overlay type.

EXAMPLE 34

A positive-working color proof of the surprint type is made in the following manner:

I. Multilayered Positive-Working Elements

Four photosensitive elements each comprising, in order, a cover sheet, a photoadherent layer which adheres to the cover sheet only in the unexposed areas, a tonable tacky contiguous layer, a releasable layer, and a sheet support, are prepared as described in Parts I, II, and III of Example 33 except that in Part II, the tonable tacky elastomer coating composition is coated on samples of polyethylene terephthalate film having a releasable layer of polydimethylsiloxane coated thereon.

II. Operations of Constructing a Surprint

The laminated elements resulting from Step I are handled as follows:

The polyethylene terephthalate cover sheet with the release coating is stripped from the tonable tacky layer of an element which is then laminated at 100° C. to a paper support (identified as Kromkote ® marketed by the Champion Paper Corporation). The element is then exposed to a half-tone positive, minus-blue, color separation film record through the clear film cover sheet in contact with the nontonable, photopolymerizable layer for 4 minutes on an exposing device of Example 33. The element is held for 5 minutes, and the clear film cover sheet is stripped from the tacky layer at an angle of from 135°–180° at a rate of about 600 inches per minute. The unexposed, negative image adheres to the clear film cover sheet thus exposing equivalent areas of the tacky elastomer contiguous layer. The bared areas of the contiguous layer are toned with a yellow toner as described in Example 33. A second photosensitive element is stripped off the release film and laminated to the surface of the yellow image and exposed to a halftone positive minus-green color separation film record in registration, the cover sheet is stripped from the contiguous layer leaving bared a positive image which is toned with a magenta (reddish) toner. The process is repeated for the minus-red and black positive records to give a high quality surprint color proof useful in the lithographic printing arts.

EXAMPLE 35

An element was made in the following manner:

I. Photoadherent Layer

A photoadherent layer which adheres to the cover sheet only in the unexposed areas was made from photosensitive composition prepared with the following ingredients:

| | |
|---|---|
| Polymethyl methacrylate (Inherent Viscosity 0.20–0.22 for a solution of 0.25 g. in 50 mls. Chloroform, at 20° C. using a No. 50 Cannon-Fenske Viscosimeter) | 1.55 g. |
| Chlorinated rubber (Parlon ® S-5 by Hercules Powder Company) 67% chlorinated - 20% solution in toluene at 25° C. has a viscosity of 4–7 centipoise) | 21.0 g. |
| Pentaerythritol triacrylate | 20.0 g. |
| 2-Tertiary butyl anthraquinone | 2.1 g. |
| Triethylene glycol acetate | 2.35 g. |
| 2,2'-Methylene-bis-(4-ethyl-6-t-butylphenol) | 2.35 g. |
| Victoria Pure Blue (CI 44045) dye | 0.50 g. |
| Methylene chloride | 200.0 g. |

The ingredients were thoroughly mixed and coated using a 0.002-inch doctor knife on a 0.001-inch transparent polyethylene terephthalate base and allowed to dry.

II. Continuous Layer: Tonable Tacky Elastomer Coating Composition

The tonable tacky elastomer coating composition of Example 33, Part II, was coated onto 0.0025-inch transparent polyethylene terephthalate support to give a dry coating weight of 100 mg/dm$^2$.

III. Lamination Procedure

Same procedure as that of Example 33, Section III was used.

IV. Exposure, Imaging and Toning Procedure

Laminated elements resulting from Step III were exposed through halftone color separation transparencies (next to the cover sheet) by means of a pulsed Xenon lamp (nuArc Flip-Top Model 17 ampere) for 2 minutes. Five minutes after exposure, the elements were delaminated by peeling the 0.001-inch polyethylene terephthalate cover sheet at an angle of at least 135 degrees and a rate of about 9,000 inches/minute. The unexposed areas of the blue photopolymerizable layer adhered to the 0.001-inch polyethylene terephthalate cover sheet and were removed with the said cover sheet as a positive working image. The complementary exposed blue image areas remained on the contiguous layer and gave a negative working image when toned with a white toner. By repeating the process with appropriate colored photopolymer layers, an overlay color proof could be obtained using the above elements.

EXAMPLE 36

An overlay color proof film is made in the following manner:

I. Photoadherent Layer: Photopolymerizable Coating Composition

A coating solution is made by mixing the following ingredients:

| | |
|---|---|
| Polymethyl methacrylate (Example 35) | 1.0 g. |
| Pentaerythritol triacrylate | 4.8 g. |
| 2-t-Butylanthraquinone | 0.25 g. |
| 2,2'-Methylene-bis-(4 ethyl-6-t-butylphenol) | 0.14 g. |
| Trichloroethylene | 70.0 g. |

The resulting solution is coated using a 0.002 inch doctor knife on a 0.001 inch transparent polyethylene terephthalate film.

II. Contiguous Layer: Tonable Elastomer Coating Composition

A coating solution is prepared by mixing the following ingredients:

| | |
|---|---|
| Block Copolymer of Styrene/Isoprene (15/85) (Brookfield viscosity, 25% solution in toluene measured at 25° C., 1200–2000 cps., Brookfield Viscosimeter, Model LVF, Spindle No. 3 at 6 RPM) | 12.00 g. |
| Methylene chloride to make | 100.0 g. |

The resulting solution is coated on 0.0025 inch thick polyethylene terephthalate film to give a coating weight of 84.0 mg/dm$^2$.

III. Laminating Procedure

Films for each color record (four) from Parts I and II are laminated as described in Example 33.

IV. Operations for Constructing an Overlay Color Proof

Carried out as described in Example 33 to give an overlay color proof.

EXAMPLE 37

Surprint type color-proofing elements are made in the following manner:

I. Photoadherent Layer: Photopolymerizable Composition

A coating solution is prepared as in Example 33 and is coated on polyethylene terephthalate film having a thickness of 0.0005 inch.

II. Contiguous Layer: Tonable Tacky Elastomer Coating Composition

A 15% solution of a block copolymer of styrene/butadiene (25/75) (Typical Mooney Viscosity ML4 at 100° C. 47) in methylene chloride is coated on an untreated polyethylene film to give a coating weight of about 120 mg/dm$^2$.

III. Laminating Procedure

Samples of the photopolymerizable element are laminated in surface to surface contact with the tacky elastomer layers on the polyethylene at room temperature with a pressure of 40 pounds per square inch.

IV. Preparation of Surprint Color Proofs

Samples from Step III are handled as described in Example 34, part IV, except that the polyethylene film is removed by stripping at an angle of 180°. Good quality surprint proofs are obtained in all cases.

EXAMPLE 38

Example 34 is repeated except that the tonable tacky elastomer layer is coated on 0.001 inch thick polyethylene film. All other operations of construction and use are carried out as outlined in Example 34 to give a good high quality surprint color-proof image useful in the printing industry.

EXAMPLE 39

Example 34 is repeated except that the tonable layer is coated from a 12% methylene chloride solution of a random copolymer of styrene and butadiene (43/57) (Raw Typical Mooney Viscosity 46) onto a 0.001 inch thick polyethylene terephthalate film which has a polydimethyl siloxane release coating. The coating weight of the tacky tonable elastomer layer is 120 mg/dm$^2$. All other operations are carried out as described in Example 34 to give a good quality color-proof.

EXAMPLE 40

Example 34 is repeated except that the cis-polybutadiene and polystyrene/butadiene copolymer in the tacky elastomer of Part II is compounded in the ratio of 70/30. A good quality surprint type color proof is obtained.

EXAMPLE 41

Example 39 is repeated except that the polystyrene copolymer is omitted from the tacky tonable layer coating composition and only the cis-polybutadiene is used in an amount to give a 9% methylene chloride solution. A good quality surprint is produced.

EXAMPLE 42

An element is made in the following manner:

I. Photoadherent Layer
   Same as that of Example 33, Part I.

II. Contiguous Layer
   A coating solution is prepared from the following materials:

| | |
|---|---|
| Styrene/butadiene block copolymer (25/75) (Typical Mooney Viscosity ML4 at 100° C. 47) | 300.0 g. |
| C.I.S. red 109 dye (1% solution in methanol) | 60.0 g. |
| Methylene chloride | 1700.0 g. |

The resulting solution is coated on 0.0025-inch polyethylene terephthalate support to give a dry coating weight of 90 mg/dm$^2$.

III. Process and Operation

The photoadherent layer (I) and contiguous layer (II) are laminated in surface to surface relationship at room temperature with a pressure of 40 pounds per square inch. After imagewise exposure, the unexposed photopolymerizable material adheres to the 0.0005 inch polyethylene terephthalate cover sheet when delaminated in the normal way. The bared areas of the tonable layer are toned with cyan toner to give a two color image suitable for use as a projection slide for visual aid purpose.

EXAMPLE 43

Positive and negative color proofs are made as follows:

I. Photoadherent Layer

A photoadherent layer containing a colorant which adheres to a 0.001 inch polyethylene terephthalate cover sheet only in the unexposed areas and which photoadheres to the contiguous layer is prepared as described in Example 9 of U.S. Pat. No. 3,770,438.

II. Contiguous Layer: Tonable Tacky Elastomer Coating Composition

The tonable tacky elastomer coating composition of Example 33, Part II, was coated onto 0.0025-inch transparent polyethylene terephthalate support to give a dry coating weight of 100 mg/dm$^2$.

III. Lamination Procedure

Same procedure as that of ExaMPLE 33, Section III was used.

IV. Exposure, Imaging and Toning Procedure

The laminated element resulting from Step III is exposed for 90 seconds through halftone color separation transparency (next to the cover sheet) to a carbon arc in an exposing device identified as a nuArc Plate Maker. Five minutes after exposure, the element is delaminated by peeling the 0.001-inch polyethylene terephthalate cover sheet at an angle of at least 135 degrees and a rate of about 9,000 inches/minute. The unexposed areas of the blue photopolymerizable layer adhere to the 0.001 inch polyethylene terephthalate cover sheet and are removed with the said cover sheet as a positive working image. This positive image when hardened by uniform exposure to actinic radiation may be used as a positive overlay transparency. The complementary exposed blue image areas remain on the contiguous layer and give a negative working image when toned with a white toner. By repeating the process with appropriate colored photopolymer layers, positive and negative overlay color proofs can be obtained using the above element.

EXAMPLE 44

A negative-working color proof of the surprint type was made in the following manner:

I. Nontonable Photoadherent Layer: Photopolymerizable Coating Composition

For the photoadherent layer a coating solution of a photopolymerizable composition was prepared by mixing together the following ingredients:

|  | Parts by Weight |
| --- | --- |
| Di-(3-methacryloxy-2-hydroxypropyl)ether of Bisphenol-A | 50.61 |
| Poly(methyl methacrylate) (inherent viscosity 1.25) | 40.49 |
| (2-o-chlorophenyl-4,5-diphenyl imidazolyl) dimer | 3.3 |
| Brightener I (described above) | 3.4 |
| 2-Mercaptobenzoxazole | 1.5 |
| Poly(ethylene oxide) (Approximate M.W. = 600,000) | 0.7 |
| Methanol | 54 |
| Methylene chloride | 846 |

Five pieces of polyethylene terephthalate film having a thickness of 0.0005 inch which had been surface treated by electrostatic discharge at 0.07 coulombs/ft.$^2$ were coated with the above solution at a coating weight of about 38 mg/dm$^2$ when dried.

II. Contiguous Layer: Tonable Tacky Elastomer Coating Composition

A coating composition was prepared by mixing together the following ingredients:

|  |  |
| --- | --- |
| Cis-polybutadiene (Raw Mooney Typical Viscosity 40) | 360.0 g. |
| Random copolymer of styrene/butadiene (40/60) (Raw Mooney Typical Viscosity 34) | 240.0 g. |
| Tetra bis[methylene 3-(3',5'-di-t-butyl-4'-hydroxyphenyl)proprionate] methane | 3.0 g. |
| Methylene chloride | 5400.0 g. |

The resulting solution was coated on samples of polyethylene terephthalate film having a releasable layer of polydimethyl siloxane coated thereon to give a coating weight of 115 mg/dm$^2$ when dried to give a layer of cis-polybutadiene and polystyrene copolymer in a ratio of 60/40.

III. Laminating Procedure

The coated photopolymerizable layer elements (I) and the tonable tacky layer elements (II) were laminated in surface to surface relationship at room temperature with a pressure of 40 pounds per square inch.

IV. Operations for Constructing a Surprint

The laminated elements resulting from Step III were handled as follows:

The polyethylene terephthalate cover sheet with the release coating was stripped from the tonable tacky layer of an element which was then laminated at 100° C. to a paper support (11 mil thick) [identified as Baryta paper manufactured by Intermill (Belgium)]. The element was then exposed to a half-tone negative, minus-blue, color separation film record through the electrostatic discharge treated clear film cover sheet in contact with the nontonable, photopolymerizable layer for 15 seconds on an exposing device identified as Berkey-Ascor ® 30×40" vacuum printer with 2KW photopolymer type Addalux lamp (peak output 3650Å) with Dylux ® filter attachment. The element was held for 1 minute and then the paper support was firmly attached to a rigid support surface by means of pressure sensitive tape, and the clear film cover sheet was stripped from the tacky layer from one corner at an angle of from 135°-180° at a rate of about 9000 inches per minute. The exposed, positive image photoadhered to the electrostatic discharge treated film thus exposing equivalent areas of the tacky elastomer contiguous layer. The bared areas of the contiguous layer were toned by embedding a yellow toner as described in Example 1. The yellow toner neither adhered to nor was embedded in the remaining unexposed image areas of the photosensitive layer. The positive image photoadhered to the electrostatic discharge treated film was similarly treated with yellow toner. Toner neither adhered to nor was embedded in the exposed photoadhered image thus demonstrating that no tacky material from the contiguous layer was removed with the photoadhered image and therefore that there is a clean adhesive break at the interface between the contiguous layer and the exposed photoadhered image areas during the peel-apart step with no concurrent cohesive failure in either layer. A second photosensitive element was stripped off the release film and laminated to the surface of the yellow image and exposed to a halftone negative minus-green color separation film record in registration, the surface treated cover sheet was stripped from the contiguous layer leaving bared a positive image which was toned with a magenta (reddish) toner. The process was repeated for the minus-red and black negative records to give a high quality surprint color proof useful in the lithographic printing arts. Over the resulting colored image layer combination there was laminated as described above a fifth element which was uniformly exposed to actinic radiation without the subsequent peel-apart step. The electrically discharged polyethylene terephthalate film which remained on the image layer combination provides a protective outer cover to the surprint color proof.

In the instance when the photoadherent layer contains a colorant, i.e., a dye, pigment, etc., complementary images are formed when the cover sheet is peeled from an imagewise exposed element. Thus, when the exposed areas adhere to the cover sheet when peeled a reverse, photoadhered colored image is obtained on the cover sheet and a duplicate, unhardened, colored image is left adhered to the contiguous layer. Alternatively, when the unexposed areas are removed with the cover sheet when peeled, a duplicate colored image is obtained on the cover sheet and a reverse, colored image is left photoadhered to the contiguous layer. In both instances, the imaged elements and coversheet may be used as is or preferably the contiguous layer is toned as described above and the element used as transparencies.

In the instance when the tacky contiguous layer contains a colorant, i.e., a dye, pigment or other particulate material, e.g., a metal powder, a two color image can be produced when the element is imagewise exposed, the cover sheet is removed, and the bared areas of the contiguous layer are toned. If the optical density of the contiguous layer is less than 3.0 in at least a portion of the color spectrum of interest then the toned element may be used as a transparency. When the optical density to transmittal radiation is 3.0 and preferably 4.0 the contiguous layer is substantially opaque and the resulting toned element can be used as a print. Thus, when the contiguous layer contains a white pigment, e.g., $TiO_2$, which renders it substantial opaque, a colored print is obtained when the element is imaged and toned as described above. Such a white element can be used as the first colored layer of a multilayered surprint or overlay print. The additional toned layers of the multicolored print would be prepared from elements having colorless contiguous layers.

We claim:

1. An image reproduction process which comprises
   (1) exposing imagewise to actinic radiation a peel apart photosensitive element comprising, in order, from top to bottom (a) a strippable cover sheet, (b) a photoadherent layer comprising a material with ethylenically unsaturated or benzophenone type groups, (c) a tonable organic contiguous layer, and optionally (d) a sheet support;
   (2) stripping the cover sheet from the element with either the exposed or unexposed areas of the photoadherent layer adhered to the cover sheet while the other areas of said photoadherent layer remain on said contiguous layer; and
   (3) toning by embedding colorant or particulate material into the areas of the contiguous layer from which areas of the photoadherent layer were removed.

2. An image reproduction process according to claim 1 wherein the exposed areas of the photoadherent layer adhere to and are removed with the cover sheet when it is stripped, while the unexposed areas of the photoadherent layer remain on the contiguous layer.

3. A process according to claim 1 wherein toning comprises embedding metal powder.

4. An image reproduction process according to claim 1 wherein exposure is through the cover sheet.

5. An image reproduction process according to claim 1 wherein said photoadherent layer is colorless.

6. An image reproduction process according to claim 1 wherein said photoadherent layer is colored and toning is with a toner that is colorless or of a different color than the photoadherent layer.

7. An image reproduction process according to claim 1 wherein the unexposed areas of the photodherent layer adhere to and are removed with the cover sheet when it is stripped, while the exposed areas of the photoadherent layer remain on the contiguous layer.

8. An image reproduction process according to claim 1 comprising laminating said contiguous layer to a surface before exposing.

9. A process of producing a multilayer imagebearing element with a process of claim 8 comprising repeating said steps of laminating, exposing, stripping, and toning one or more times, each succeeding element having its tonable layer in surface to surface contact with the image-bearing surface of the last previously laminated element.

10. A process according to claim 1 wherein the element has a sheet support (d) on the surface of said contiguous layer opposite to the surface of the contiguous layer which is in contact with the photoadherent layer.

11. An image reproduction process comprising (1) exposing the element of claim 10 imagewise to actinic radiation, (2) stripping the cover sheet from the element with the exposed areas of the photoadherent layer adhered to the cover sheet while the unexposed areas of the photoadherent layer remain on said contiguous layer, and (3) toning the areas of the contiguous layer from which the exposed areas of the photoadherent layer were removed.

12. A process according to claim 11 comprising, before exposing, removing the sheet support and laminating the contiguous layer of the element to a surface.

13. A process according to claim 1 comprising, after toning, laminating the contiguous layer of an element which comprises, in order, from top to bottom (a) a strippable cover sheet, (b) a photoadherent layer comprising a material with ethylenically unsaturated or benzophenone type groups, and (c) a tonable organic contiguous layer, to the image-bearing surface of said element that has been toned, exposing the entire element nonimagewise to actinic radiation, stripping off the cover sheet of the laminated element with the photoadherent layer adhering thereto, and dusting the tonable contiguous layer with a particulate material.

14. A process according to claim 1 wherein the contiguous layer of said element contains an added colorant.

15. A process according to claim 14 wherein said colored contiguous layer has an optical density of at least 3.0.

16. A process according to claim 1 wherein the colorant or particulate material is dry.

17. A process according to claim 2 wherein after step (2) the stripped element is uniformly exposed to actinic radiation.

18. A process according to claim 9 wherein an additional element is laminated to the image bearing surface of the last previously laminated element and the multilayer image bearing element is uniformly exposed to actinic radiation.

19. A process according to claim 1 wherein the contiguous layer is tacky.

20. A process according to claim 19 wherein the contiguous layer is nonphotosensitive.

* * * * *

UNITED STATES PATENT OFFICE
CERTIFICATE OF CORRECTION

PATENT NO. : 4,174,216
DATED : NOVEMBER 13, 1979
INVENTOR(S) : ABRAHAM BERNARD COHEN AND ROXY NI FAN

It is certified that error appears in the above-identified patent and that said Letters Patent are hereby corrected as shown below:

| Column | Line | |
|--------|------|---|
| 8  | 8  | between "of" and "layer" delete "the" |
| 12 | 1  | delete "hz,1/32" |
| 13 | 16 | "0.0001" should be --0.001--. |
| 17 | 66 | "(2-O-Chlorophenyl-4,5-diphenyl imidazolyl)dimer" should be --(2-o-Chlorophenyl-4,5-diphenyl imidazolyl)dimer--. |
| 21 | 9  | "(MW 500,000)" should be --(MW~500,000)--. |
| 22 | 53 | after "resin" the phrase "In addition, each resulting solu-" should begin a new line |

Signed and Sealed this

First Day of July 1980

[SEAL]

Attest:

SIDNEY A. DIAMOND

Attesting Officer

Commissioner of Patents and Trademarks